United States Patent [19]

Tower

[11] Patent Number: 4,467,342
[45] Date of Patent: Aug. 21, 1984

[54] MULTI-CHIP IMAGER

[75] Inventor: John R. Tower, West Deptford, N.J.

[73] Assignee: RCA Corporation, New York, N.Y.

[21] Appl. No.: 398,601

[22] Filed: Jul. 15, 1982

[51] Int. Cl.³ .................... H01L 27/14; H01L 31/00; H01L 29/78; H01L 27/10

[52] U.S. Cl. ........................................ 357/30; 357/24; 357/45

[58] Field of Search .............................. 357/24, 30, 45

[56] References Cited

U.S. PATENT DOCUMENTS 3,939,555  2/1976  Jantsch et al. ........................ 357/45

OTHER PUBLICATIONS

"A High Resolution Buttable Time Delay and Integrate Imaging CCD" by A. A. Ibrahim, et al, CCD, 1978 International Conference on the Application of Charge Coupled Devices, Oct. 25-27, Proceedings, pp. 1-2-5—1-40.

Primary Examiner—Gene M. Munson
Attorney, Agent, or Firm—J. S. Tripoli; G. J. Seligsohn

[57] ABSTRACT

Thinned, contiguous imager chips, are arranged end-to-end, and accurately positioned relative to one another, that is, are positioned so that the proper spacing period between adjacent imager pixel detectors is maintained, by using a lap joint between contiguous chips. The use of a lap joint rather than a butt joint permits operation without any significant phase difference occurring and without any pixel detector gap occurring at the lap joint seam. Further, such a lap joint permits proper operation to be obtained even with relatively coarse chip-edge tolerances.

8 Claims, 6 Drawing Figures

MULTI-CHIP IMAGER

This invention relates to a solid-state radiant energy imager and, more particularly, to such an imager comprised of at least two contiguous juxtaposed solid-state imager chips.

Reference is made to the article "A High Resolution Buttable Time Delay and Integrate Imaging CCD," by Ibrahim et al, which appears on pp. 1–25 et seq of the Proceedings of the 1978 International Conference on the Application of Charge Coupled Devices. As indicated in this article, there is a need for solid-state radiant energy imagers (e.g., CCD imagers) comprised of an array of periodically spaced pixel detectors, in which the array (in at least one of two dimensions) is so large that it requires two or more contiguous juxtaposed solid-state imager chips, all of the pixel detectors in this one dimension having the same given periodic spacing. In accordance with the teaching of this article, a butt joint is provided between adjacent edges of juxtaposed chips. The article brings out that a gap in the periodic spacing of the pixel detectors occurs at the butt joint. Specifically, the article states that the contiguous chips are "buttable with only 2 sensor elements gap between adjacent devices," where the term "elements" refers to pixel detectors and the term "devices" refers to imager chips.

In accordance with the principles of the present invention, the juxtaposed chips are joined by a lap joint, rather than by a butt joint. Further, each of the juxtaposed chips is sufficiently thinned so that radiant energy illuminating the lap joint can pass through the chips and reach all pixel detectors within the overlapping end portions of the chips with insignificant attenuation, and so that the respective depth positions of the pixel detectors of overlapped chips are still both within the depth of focus of conventionally employed imaging optics. This permits contiguous chips to be joined without any gap in their periodic spacing of the pixel detectors. Further, in order to prevent an excessive phase difference between the periodic spacing of the pixel detectors on one contiguous chip with respect to that on another contiguous chip, when the two contiguous chips are joined by a butt joint, it is required that the juxtaposed edges of the two chips be painstakingly prepared to provide a very fine tolerance with great accuracy over the entire thickness of each of the edges of the juxtaposed chips. The lap joint technique of the present invention, without the requirement of painstaking preparation, substantially eliminates the occurrence of any such phase difference.

Figure 4A:
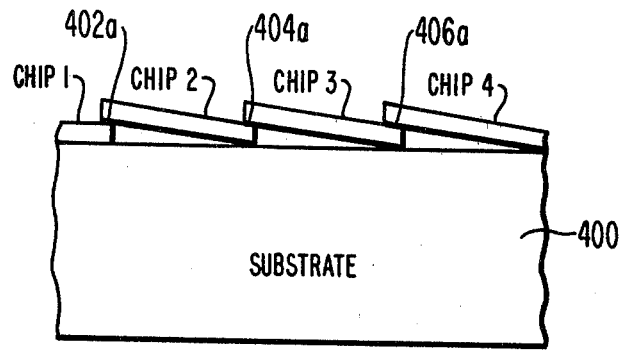
Figure 4B:
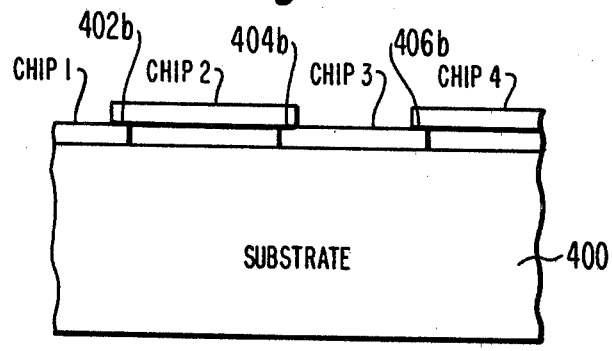
Figure 5:
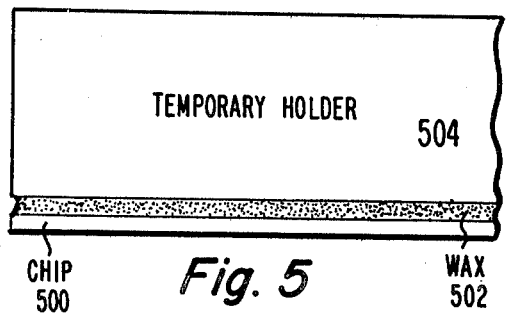

FIGS. 4a and 4b, illustrate, respectively, a shingle pattern and a step pattern for arranging the lap joints of three or more juxtaposed chips attached to the surface of a substrate, and FIG. 5 illustrates a temporary holder which may by employed in an illustrative method for joining on a substrate one chip to a juxtaposed chip with a lap joint which incorporates the principles of the present invention.

Figure 1:
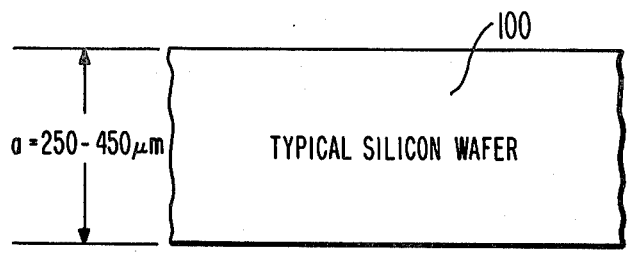
FIG. 1 is a diagrammatic showing of the thickness of a typical silicon wafer employed in the fabrication of imager chips.

Referring to FIG. 1, there is shown a typical silicon wafer 100 normally employed by the prior art in the fabrication of solid-state imager chips, such as charge-coupled-device (CCD) imager chips, for example. As indicated in FIG. 1, the thickness a of typical silicon wafer 100 is in the range of 250–450 micrometers (equivalent to 10–18 mils).

Figure 2:
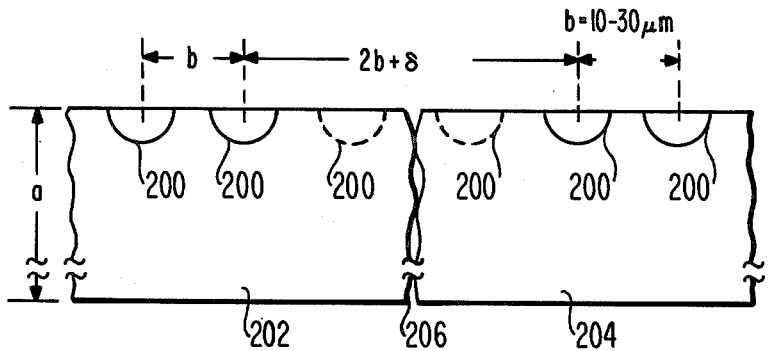
FIG. 2 shows a butt joint between two juxtaposed imager chips of the type employed in the prior art and disclosed in the aforesaid Ibrahim et al article.

Referring to FIG. 2, there is shown an array of periodically spaced pixel detectors 200 situated on the upper surface of each of juxtaposed imager chips 202 and 204, which are joined by a butt joint of the type disclosed in the aforesaid prior-art Ibrahim et al article. The pixel detectors 200 are illustrated schematically in FIGS. 1 and 2 as circular regions. In practice, each such a pixel in a CCD, for example, comprises a group of electrodes, such as polysilicon electrodes (3 in the case of a 3 phase system, for example) making up one stage of the CCD, these electrodes being insulated from one another and from the substrate, and the substrate region underlying these electrodes. The operation of these elements is well understood in the art, and is discussed in the aforesaid prior-art Ibrahim et al. article. The thickness a of each of chips 202 and 204 is that of a typical silicon wafer 100 shown in FIG. 1 (i.e., 250–450 $\mu$m). However, the center-to-center spacing period b between adjacent pixels 200 is only in the range of 10–30 $\mu$m. In FIG. 2, because the size of the thickness a is so very much greater than the size of the spacing period b of pixel detectors 200 of both chips 202 and 204, the thickness of chips 202 and 204 in FIG. 2 has been shown greatly compressed.

In order to maintain the unform spacing period b between the adjacent end pixel detectors 200 of contiguous chips 202 and 204 the prior-art imager shown in FIG. 2, so that no substantial phase shift in this spacing period occurs at butt joint 206, requires that the butted edges of chips 202 and 204 forming butt joint 206 be determined with great accuracy and fine tolerance over the entire area of the buttable vertical edge surfaces of chips 202 and 204 forming butt joint 206. However, a tolerance of about 2 $\mu$m is about the best that can be hoped for over a thickness a of between 250–450 $\mu$m. While 2 $\mu$m is negligible compared to 250–450 $\mu$m, it is not negligible compared to the spacing period b of between 10–30 $\mu$m. For this reason, the buttable edges of butt joint 206 are shown in FIG. 2 as wavy lines. Further, the buttable edge of each of chips 202 and 204 must be exactly positioned, with respect to both the pixel detectors 200 of chip 202 and to the pixel detectors 200 of chip 204, in order to prevent any significant phase shift between the spacing period of the two contiguous chips from occurring at butt joint 206. Therefore, the buttable vertical edge surfaces forming butt joint 206 must be prepared with great care and, hence, at relatively high expense. Such preparation results in rendering inoperative the end pixel detector 200 (shown in dashed line) of each of chips 202 and 204 situated closest to the buttable edges forming butt joint 206. This fact, together with the fact that there is a tolerance error $\delta$ in the positioning of the buttable edges of butt joint 206, means that there is a gap of $2b+\delta$, shown in FIG. 2, between adjacent operable pixel detectors 200 (shown in continuous line) on opposite sides of butt joint 206. For instance, in the particular example of the FIG. 2 prior-art imager disclosed in the aforesaid Ibrahim et al article, the spacing period b is 13 μm (with the size of each pixel detector 200 being 8 μm and space between adjacent pixel detectors 200 on the same chip being 5 μm), while the gap size, 2b+δ, is 30 μm (i.e., δ is about 4 μm).

Figure 3:
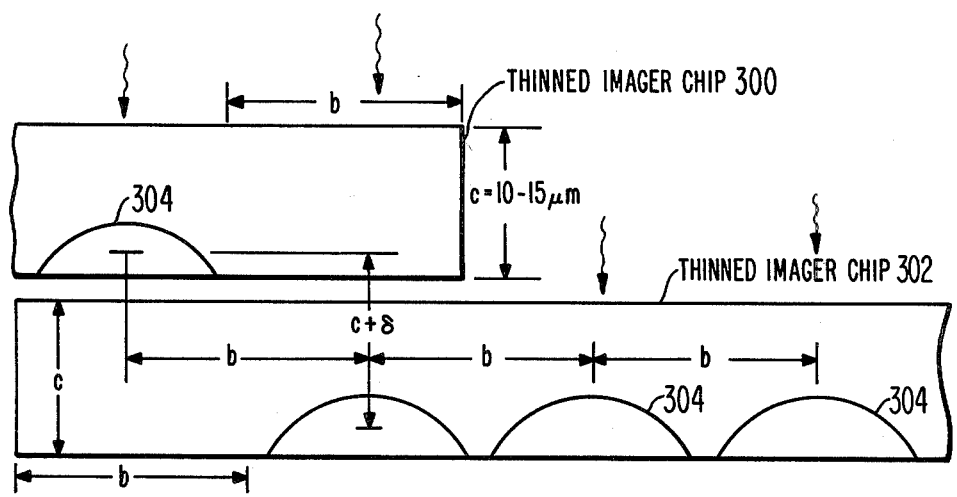
FIG. 3 illustrates an embodiment of a lap joint between two juxtaposed chips that incorporates the principles of the present invention.

Referring to FIG. 3, there is shown an embodiment of the present invention in which a lap joint (rather than the prior-art butt joint) is employed in joining thinned imager chip 300 to contiguous thinned imager chip 302. Thinned imager chips, per se, are known in the art and heretofore have been used to permit back illumination of charge-coupled-device (CCD) imager pixel detectors. Back illumination has the advantage of providing a more panchromatic image response than is provided by front illumination. Specifically, back illumination reduces the relatively high attenuation in the blue portion of the spectrum exhibited by the one or more polysilicon layers (not explicitly shown but within the confines of dimension C), employed as imager electrodes, that are situated on the front surface of an imager chip. Such polysilicon layers are normally necessary components of the complete structure of any silicon imager.

Shown in FIG. 3, each of thinned imager chips 300 and 302 is oriented to be back illuminated, with periodically spaced pixel detectors 304 of chips 300 and 302 situated on the bottom (i.e., front) surface thereof, with projected image illuminating light, indicated by the arrow, provided from above by imaging optics (not shown) and being incident on the top (i.e., back) surface thereof. As shown in FIG. 3, the periodic spacing between pixel detectors 304 of both thinned imager chips 302 is b (10–30 μm); that is, in the same range as that of the prior-art imagers shown in FIG. 2. Further, each of the overlapping end portions of chips 300 and 302 extends a distance equal to (or greater than) b beyond the end pixel detector 304 of that imager chip. In addition, as shown in FIG. 3, the thickness c of each of thinned imager chips 300 and 302 is in the range of only 10–15 μm (rather than being in the prior-art thickness range of 250–450 μm of the image of FIG. 2). Therefore, in the case of thinned imager chips 300 and 302, illuminating light may pass through the entire thickness of chip 300 and then through imager chip 302 to reach a pixel detector 304 of imager chip 302 without undergoing any significant absorption before reaching a pixel detector 304 of chip 302. In addition, the maximum difference in depth between the respective positions of pixel detectors 304 of thinned imager chips 300 and 302 is small enough to be well within the depth of focus of conventional imaging optics. As shown in FIG. 3, the bottom surface of 304 is slightly above the top surface of chip 302 and the vertical distance (center-to-center spacing) between pixel detectors 304 of chip 300 and those of chip 302 is shown as being c+δ. The reason for this is to indicate that there is some relatively small tolerance error in the thickness c of each of the thinned imager chips 300 and 302. For instance, in particular example of the embodiment of the present invention shown in FIG. 3, the value of b was 25 μm, the value of c was 15 μm and the value of c+δ was 16 μm (i.e., δ was abut 1 μm).

FIG. 4a shows one arrangement for organizing a multi-chip imager, comprising three or more chips disposed on a substrate, employing the principles of the present invention. Specifically, substrate 400, which is conventional, may be comprised of a material such as ceramic. A plurality of chips, including chips 1, 2, 3 and 4 are bonded to a surface of substrate 400. As shown, the left end portion of chip 2 overlaps the right end portion of chip 1 in lap joint 402a; the left end portion of chip 3 overlaps the right end portion of chip 2 in lap joint 404a, and the left end portion of chip 4 overlaps the right end portion of chip 3 in lap joint 406a. The arrangement of lap joints 402a, 404a and 406a, shown in FIG. 4a, organizes the chips 1, 2, 3 and 4 in a single pattern.

Alternatively, as shown in FIG. 4b, the left end portion of chip 2 may overlap the right end portion of chip 1 in lap joint 402b; the right end portion of chip 2 may overlap the left end portion of chip 3 in lap joint 404b, and the left end portion of chip 4 may overlap the right end portion of chip 3 in lap joint 406b. The arrangement of lap joints 402b, 404b and 406b organizes chips 1, 2, 3 and 4 into a step pattern. In all other respects, the arrangement in FIG. 4b is similar to that described in connection with FIGS. 3 and 4a.

Regardless of what particular arrangement is employed, it is always necessary, in the fabrication of a multi-chip imager employing the principles of the present invention, that the spacing period b between pixel detectors shown in FIG. 3 be maintained between the adjacent end pixel detectors 3094 of each pair of contiguous chips. FIG. 5 shows a temporary holder which is useful in an illustrative method for fabricating a multi-chip imager on a substrate, in which each pair of contiguous imager chips is arranged as shown in FIG. 3.

In performing this illustrative method, it is desirable to employ an ultra-violet (UV) cured epoxy to bond each of the imager chips of the multi-chip imager to the substrate, one at a time. As shown in FIG. 5, in order to accomplish this, a single thinned imager chip 500 (of the type shown in FIG. 3) is attached to a temporary holder 504, such as a glass slide, by a wax seal 502. In order for an operator to properly position each of the contiguous chips, in turn, on the substrate, it is necessary for him to employ a microscope and to support temporary holder 504 by means of a micrometer (neither of which are shown in FIG. 5).

First assume that chip 500 is the first chip to be positioned and bonded to a substrate. In this case, under the guidance of the operator, who is observing chip 500 under the microscope and is controlling the positioning of the chip with the micrometer, first chip 500 is first properly positioned on the substrate and is then bonded in its proper position to the substrate. Preferably, this bonding is accomplished with the UV cured epoxy, discussed above. More specifically, chip 500 may be prepared with a coating of uncured epoxy on its surface opposite the one abutting the wax, that is on its surface which will contact the surface of the substrate. Then chip 500 is properly positioned on the substrate and an incident pulse of ultra-violet light is applied, thereby curing the epoxy and bonding chip 500 in its proper position on the substrate. Thereafter, wax seal 502 is melted and temporary holder 504 is detached from chip 500.

Assume now that chip 500 is the second chip to be attached to the substrate. In accordance with the principles of the present invention, this second chip is to be positioned in contiguous relationship with respect to the first chip with an end portion of the second chip positioned in such overlapping relationship with respect to the end portion of the first chip that the periodic spacing of the pixel detectors of the first and second chips is maintained without any substantial phase difference occurring at the lap joint. In order to accomplish this, the operator situates the second chip 500 on the substrate with the end portion thereof which is distal from wax seal 502 overlapping an end portion of the already bonded first chip. Then, the operator slides the second chip 500 back and forth (by operating the micrometer supporting temporary holder 504), while observing the overlapping portions of the first and second chips (in the microscope), thereby to attain the relative positioning of the first and second chips shown in FIG. 3 (i.e., a center-to-center spacing distance between the overlapping adjacent end pixel detectors of the first and second contiguous chips that is substantially equal to b). When this proper spacing distance b is achieved, an incident pulse of ultra-violet light is applied to bond the second chip to the substrate, in its proper overlapping position with respect to the first chip. Wax seal 502 is then melted and temporary holder 504 is detached from second chip 500.

The process just described for bonding the second chip to the substrate, with an end portion thereof in overlapping relationship with an end portion of the first chip, may be repeated as many times as is necessary to provide a multi-chip imager with any desired number of contiguous imager chips. Such a multi-chip imager may be arranged in the shingle pattern shown in FIG. 4a, the step pattern shown in 4b, or in a more complicated pattern (i.e., a pattern that includes one or more shingle pattern portions and one or more step pattern portions).

It should be understood that a multi-chip imager incorporating the principles of the present invention may be fabricated by other methods then the illustrative method discussed above.

Referring back to FIG. 3, it should be noted that the edge of thinned imager chip 300 extends a relatively large distance b (25 $\mu$m in the example given above) beyond the end pixel detector 304 of thinned imager chip 300. The distance between the edge of thinned imager chip 302 and the end pixel detector 304 of chip 302 is also b (although it may be greater than b). The relatively large distance b is sufficient to permit the edge to be defined by a relatively coarse tolerance (compared to the 2 $\mu$m tolerance required by the prior-art butt-joint multi-chip imager of FIG. 2), without rendering either adjacent end pixel detector 304 of chips 300 and 302 inoperative. Further, conventional chemical/plasma etching is highly accurate and straight forward in preparing edges having only the 10–15 $\mu$m thickness of the edges of thinned imager chips 300 and 302 (but such etching is not accurate in preparing edges having the much larger 240–450 $\mu$m thickness of a typical silicon wafer employed by the prior butt-joint multi-chip imager of FIG. 2).

What is claimed is:

1. In a solid-state radiant energy imager adapted to be illuminated by means of imaging optics with an image, said imager being comprised of at least two contiguous juxtaposed solid-state imager chips in which each of said two chips includes at least one corresponding line of periodically spaced pixel detectors, the respective spacing periods of said pixel detectors of said corresponding lines of said two chips being substantially the same as one another; the improvement:

wherein an end portion of one of said two chips overlaps an end portion of the other of said two chips and said two chips are joined together by a lap joint in which the extent of overlap of said two chips is arranged such that the spacing distance, between a pixel detector situated within said end portion of said one of said two chips and a pixel detector situated within said end portion of said other of said two chips, is substantially equal to that of said respective spacing periods of said corresponding lines of said two chips, so that no pixel detector gap occurs at lap joint seam, and wherein each of said two chips is sufficiently thinned so that radiant energy illuminating said lap joint can pass through said chips and reach all pixel detectors within said overlapped end portions of said chips with insignificant attenuation, and so that the respective depth positions of the pixel detectors of said two overlapped chips are both within the depth of focus of said imaging optics.

2. The imager defined in claim 1, wherein said imager comprises at least three contiguous juxtaposed thinned imager chips in which a first of said three chips includes first and second end portions, and wherein one end portion of said first chip overlaps one end portion of a second of said three chips to form a first lap joint and the other end portion of said first chip overlaps one end portion of a third of said three chips to form a second lap joint.

3. The imager defined in claim 2, wherein the arrangement of the overlapping relationship forming said first lap joint and the arrangement of the overlapping relationship forming said second lap joint are such as to form said three chips into a shingle pattern.

4. The imager defined in claim 2, wherein the arrangement of the overlapping relationship forming said first lap joint and the arrangement of the overlapping relationship forming said second lap joint are such as to form said three chips into a step pattern.

5. The imager defined in claim 1, wherein said period is in the range of 10–30 $\mu$m micrometers.

6. The imager defined in claim 5, wherein the thickness of each of said thinned chips is in the range of 10–15 micrometers.

7. The imager defined in claim 6, wherein said period is substantially 25 micrometers, wherein the thickness of each of said thinned chips is substantially 15 micrometers, and wherein the distance in the thickness direction between the respective positions of pixel detectors of a first of said two chips and of a second of said two chips is substantially 16 micrometers.

8. The imager defined in claim 1, wherein said imager chips of said imager are silicon chips.

* * * * *

UNITED STATES PATENT AND TRADEMARK OFFICE
CERTIFICATE OF CORRECTION

PATENT NO. : 4,467,342

DATED : August 21, 1984

INVENTOR(S) : John R. Tower

It is certified that error appears in the above-identified patent and that said Letters Patent is hereby corrected as shown below:

Column 1, line 67, "by" should be --be--.

Column 4, line 6, "single" should be --shingle--.

Signed and Sealed this

Ninth Day of April 1985

[SEAL]

Attest:

DONALD J. QUIGG

Attesting Officer     Acting Commissioner of Patents and Trademarks